United States Patent [19]

Jensen et al.

[11] Patent Number: 5,729,230
[45] Date of Patent: Mar. 17, 1998

[54] DELTA-SIGMA Δ-Σ MODULATOR HAVING A DYNAMICALLY TUNABLE CONTINUOUS TIME GM-C ARCHITECTURE

[75] Inventors: Joseph F. Jensen, Malibu; Gopal Raghavan, Canoga Park; Albert E. Cosand, Agoura Hills, all of Calif.

[73] Assignee: Hughes Aircraft Company, Los Angeles, Calif.

[21] Appl. No.: 588,666

[22] Filed: Jan. 17, 1996

[51] Int. Cl.$^6$ .................................................. H03M 3/00
[52] U.S. Cl. .......................... 341/143; 341/155; 341/118
[58] Field of Search .............................. 341/143, 155, 341/118; 364/825; 333/166

[56] References Cited

U.S. PATENT DOCUMENTS

| | | | |
|---|---|---|---|
| 4,774,518 | 9/1988 | Fukuhara | 342/389 |
| 4,799,025 | 1/1989 | La Quéan | 329/107 |
| 4,857,928 | 8/1989 | Gailus et al. | 341/143 |
| 5,055,843 | 10/1991 | Ferguson, Jr. et al. | 341/143 |
| 5,157,350 | 10/1992 | Rubens . | |
| 5,182,477 | 1/1993 | Yamasaki | 307/494 |
| 5,371,475 | 12/1994 | Brown . | |
| 5,392,042 | 2/1995 | Pellon | 341/143 |
| 5,491,477 | 2/1996 | Goetschel et al. . | |
| 5,500,645 | 3/1996 | Ribner et al. | 341/143 |

OTHER PUBLICATIONS

"Sigma–Delta ADCs and DACs, Sigma–Delta Overview", *Mixed Signal Design Seminar*, Analog Devices, Inc. Section VI:1–12, 1991.

Comino et al., "A First–Order Current–Steering Sigma–Delta Modulator", *IEEE Journal of Solid–State Circuits*, vol. 26, No. 3, Mar. 1991, pp. 176–183.

Shoaei et al., "Optimal (Bandpass) Continuous–Time ΣΔ Modulator", *Proceedings ISCAS*, vol. 5, pp. 489–492, 1994.

Heij et al., "Transconductor and Integrator Circuits for Integrated Bipolar Video Frequency Filters", *Proceeding of ISCAS*, 1989, pp. 114–117.

Voorman et al., "Integration of Analog Filters in a Bipolar Process", *IEEE Journal of Solid State Circuits*, vol. SC–17, No. 4, Aug. 1982, pp. 713–722.

Veirman et al., "Design of a Bipolar 10–MHz Programmable Continuous–Time 0.05° Equiripple Linear Phase Filter", *IEEE Journal of Solid–State Circuits*, vol. 27, No. 3, Mar. 1992, pp. 324–331.

Sansen et al., "Distortion in Bipolar Transistor Variable–Gain Amplifiers", *IEEE Journal of Solid–State Circuits*, vol. SC–8, No. 4, Aug. 1973, pp. 275–282.

Singor et al., "Switched–Capacitor Bandpass Delta–Sigma A/D Modulation at 10.7 MHz", *IEEE Journal of Solid–State Circuits*, vol. 30, No. 3, Mar. 1995, pp. 184–192.

Yang, S., et al. "A Tunable Bandpass Sigma–Delta A/D Conversion for Mobile Communication Receiver" Dept. of Electrical and Electronic Engineering, Victoria University of Technology, 1994 IEEE, pp. 1346–1350.

Shoaei, O., et al. "*Optimal (Bandpass) Continuous–Time ΔΣ Modulator*" Dept. of Electronics, Carleton University, Ottawa, Ontario, Canada K1S 5B6, (1994) pp. 489–492.

de Heij, W.J.A., et al. "*Transconductor and Integrator Circuits For Integrated Bipolar Video Frequency Filters*" University of Twenty, The Netherlands, pp. 114–117.

*Primary Examiner*—Fritz Fleming
*Assistant Examiner*—Jason L. W. Kost
*Attorney, Agent, or Firm*—V. D. Duraiswamy; W. K. Denson-Low

[57] ABSTRACT

A continuous-time tunable Gm-C architecture for a ΔΣ modulator includes a tunable resonator and a low bit rate, high sample rate quantizer connected in a feedback loop. The resonator shapes the quantization noise spectrum so that the bulk of the quantization noise occurs outside the signal spectrum. A tunable Gm cell tunes the resonator's resonant frequency to maximize the modulator's SNR. The tunable Gm cell includes a fixed Gm cell having transconductance $G_f$, a current divider and a recombination circuit that together effectively multiply $G_f$ by a factor α, where $-1 \leq \alpha \leq 1$, without effecting the cell's common mode current $I_{cm}$. A positive current source supplies $I_{cm}$, while maintaining a common mode resistance of R/2 and a theoretically infinite differential mode resistance. Thus, the resonator's resonant frequency can be varied from DC to approximately 1 Ghz while maintaining a stable common mode operating point and improving the modulator's quality factor.

28 Claims, 8 Drawing Sheets

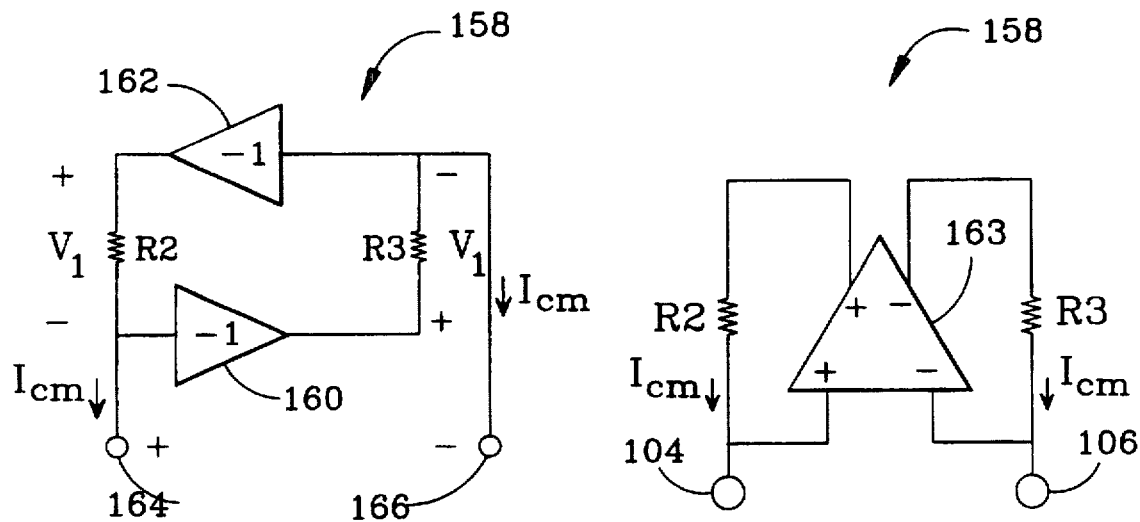
FIG.8a
FIG.8b
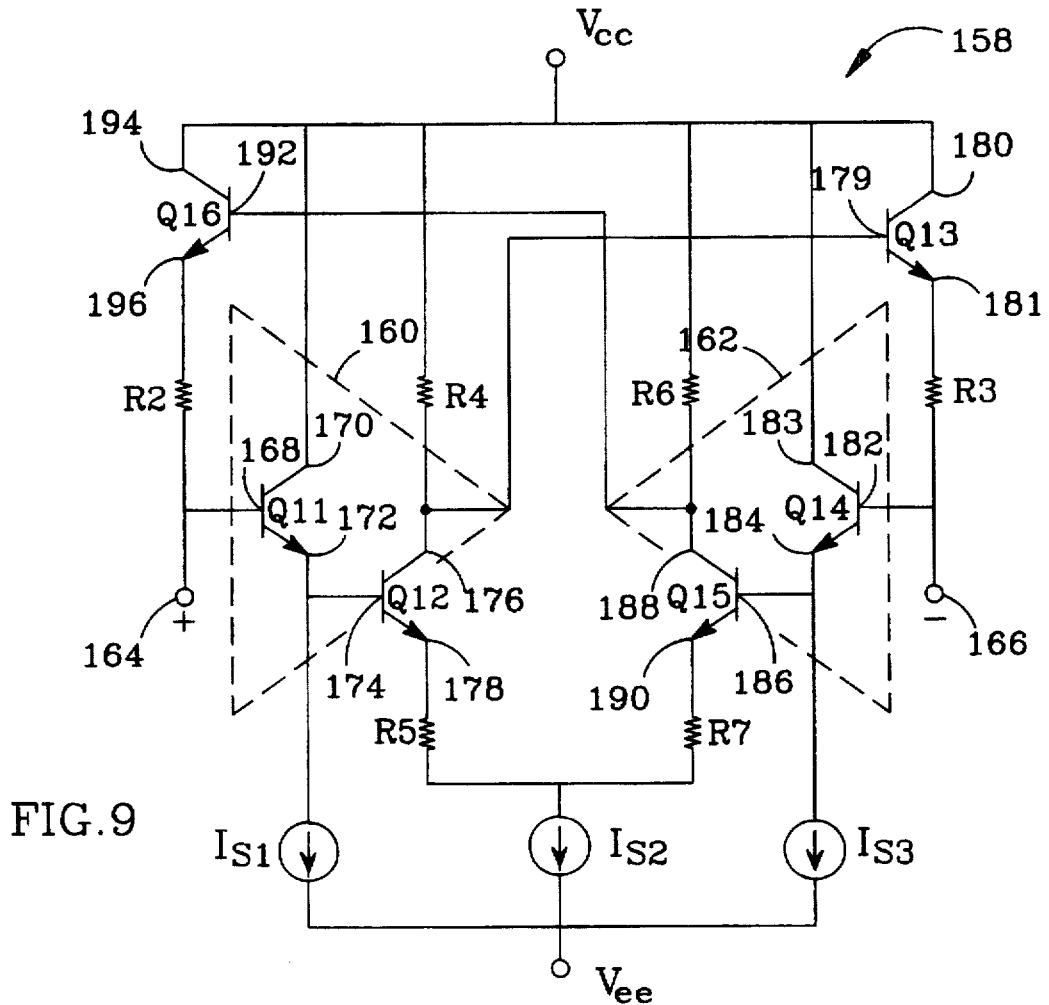
FIG.9

DELTA-SIGMA Δ-Σ MODULATOR HAVING A DYNAMICALLY TUNABLE CONTINUOUS TIME GM-C ARCHITECTURE

BACKGROUND OF THE INVENTION

1. Field of the Invention

This invention relates to Delta-Sigma (ΔΣ) modulators and more specifically to a dynamically tunable continuous time Gm-C architecture for a ΔΣ modulator.

2. Description of the Related Art

A ΔΣ modulator utilizes oversampling and noise shaping to increase the signal-to-noise ratio (SNR) of an analog to digital converter (ADC). The ΔΣ modulator includes a comparator and a filter in a feedback loop. The comparator digitizes an analog signal at a very low resolution, typically 1-bit, at a very high sampling rate $kf_s$, where $f_s$ is twice the signal bandwidth i.e. the Nyquist rate, and k is the oversampling ratio. Oversampling expands the bandwidth of the ADC so that the signal spectrum occupies only a portion of the total bandwidth. The filter shapes the comparator's otherwise uniform quantization noise spectrum so that the bulk of the quantization noise occurs outside the signal spectrum. As a result, the SNR in the signal spectrum is increased dramatically.

A well known low-pass filter (LPF) ΔΣ modulator is described in "Mixed-Signal Design Seminar," Analog Devices, Inc. Section VI:1–12, 1991. In this architecture, an integrator is placed in the feedback loop. The integrator's amplitude response is proportional to 1/f, where f is the input frequency. As a result of the feedback, the integrator looks like a LPF to the input signal and a high-pass filter (HPF) to the quantization noise. Thus, the integrator shapes the quantization noise spectrum so that most of the noise occurs at the higher frequencies outside the signal bandwidth. Comino, "A First-Order Current-Steering Sigma-Delta Modulator," IEEE Journal of Solid-State Circuits, Vol. 26, No. 3, March 1991, pp. 176–183 discloses a continuous-time CMOS implementation of the LPF architecture.

These architectures are strictly limited to place all of the zeros in the quantization noise spectrum at DC. As a result, the ΔΣ modulator does not provide optimum noise rejection for LPF designs and cannot implement band-pass filter designs. Furthermore, at high signal frequencies it becomes very difficult to oversample at a sufficiently high ratio and the integration of the quantization noise reduces the SNR. Comino reported baseband signal frequencies of only 72 kHz.

A BPF ΔΣ modulator is implemented by placing a resonator in the feedback path. The resonator's amplitude response is $H(s)=s/(s^2+\omega_0^2)$, where $\omega_0$ is the resonant frequency and $s=\sigma+j\omega$ is a complex number where $\sigma$ is a real convergence parameter and $\omega$ represents radial frequency. As a result of the feedback, the resonator looks like a LPF to the input signal and a bandstop filter to the quantization noise. The resonator is designed so that the filter's stop band coincides with the signal spectrum. Thus, the resonator shapes the quantization noise spectrum so that most of the noise occurs at frequencies outside the signal spectrum. Typically, the modulator's resonant frequency can be trimmed by at most ±10–30% of the resonant frequency to compensate for processing variations only.

Shoaei et al, "Optimal (Bandpass) Continuous-Time ΔΣ Modulator" Proceedings ISCAS, vol. 5, pp.489–492, 1994 disclose a systematic technique for designing a ΔΣ modulator. The modulator's open-loop transfer function is obtained by the pulse-invariant transformation of its discrete-time equivalent. FIG. 5 of Shoaei shows a fourth order bandpass structure including two Gm-C resonators connected in cascade to define the modulator's fixed resonant frequency. The standard fixed transconductance (Gm) cell has a high band-width, high quality factor and constant common mode current, which are required to maintain the overall performance and SNR of the ΔΣ modulator. A circuit's quality factor $Q=\Delta\omega/\omega_0$, where $\Delta\omega=\omega_2-\omega_1$ and $\omega_2$, $\omega_1$ are the frequencies on either side of the resonant frequency at which the signal amplitude is reduced by 3 dB.

On page 492, section 3.4 Shoaei discusses the effects of shifted resonant frequencies due to processing variations. In a spread-pole design, a 1% out-of-band shift causes a 10 dB loss. Therefore, "because of inaccuracy of tuning algorithms it is always better to deliberately shift the resonant frequencies slightly inward in the band in spread-pole design." This fixed preshifting of the designed resonant frequencies to compensate for the worst case processing errors induces a 4 db SNR loss, but makes the modulator less sensitive to resonant frequency changes due to processing errors.

Tunable Gm cells are used to compensate for variations in active filter components where low bandwidth and low quality factor are not an issue. Heij et al, "Transconductor and Integrator Circuits for Integrated Bi-polar Video Frequency Filters," Proceeding of ISCAS, 1989, pp. 114–117, disclose two matched resistors R1 connected in parallel around a variable transconductance cell, which includes a standard Gm cell whose transconductance $G_T$ is current dependent. The matched resistors preferably have a very high resistance so that the Gm cell's differential mode impedance is also very high. Thus, all of the differential signal current is used to charge the integrating capacitors and does not leak significantly through the resistors. However, the high resistance also produces a high common mode impedance such that any variations in the common mode input signal are amplified. This reduces the tuning bandwidth to approximately 20% around the center resonant frequency. The total variable transconductance is:

$$G = \frac{1}{R_1} + G_T \qquad (1)$$

where $|G_T|<0.2/R1$. As a result, the transconductance G is strictly positive. Furthermore, the large series resistance lowers the transconductance of the Gm cell's, and hence, the modulator's quality factor.

Voorman et al, "Integration of Analog Filters in a Bi-polar Process," IEEE Journal of Solid State Circuits, vol. SC-17, pp. 713–722, Aug. 1982 discloses a tunable Gm cell that uses conventional current multipliers to vary the cell's transconductance by a tuning factor α. However, the common mode current is varied by the same factor α, which limits the tuning bandwidth to 10–15% of the resonant frequency. Furthermore, α cannot be set to zero, and hence the Gm cell is limited to strictly positive transconductances.

To improve distortion and increase speed, known fixed and tunable Gm cells are often implemented with all NPN bi-polar transistors. As a result, the Gm cell only sinks current. It thus becomes necessary to provide a positive current source (PCS) that supplies a common mode current, which is then modulated by the input signal. One approach is to tie a resistor to a positive supply voltage to provide the common mode current. This approach has the same drawbacks as Heij's tunable Gm cell. A second approach is to use PNP, PMOS or P-JFET transistors to supply the common mode current. This provides high common mode resistance, which requires common mode feedback to compensate the circuit and lower the resistance. The PNP transistors in a convention bipolar process and the common mode feedback are very slow. Processes with fast transistors of both polarities are more complex and, thus more expensive. Another approach is to use a negative resistance cell as disclosed by Veirman et al, "Design of a Bipolar 10 Mhz Programmable Continuous Time 0.05° Equiripple Linear Phase Filter," IEEE Journal of Solid-State Circuits, vol. SC-27, pp. 324–331, March 1992. The cell's common mode resistance is a fixed resistance R and its differential mode resistance is theoretically infinite. However, the cell's resistance must be matched exactly to achieve a very high differential mode resistance.

SUMMARY OF THE INVENTION

In view of the above problems, the present invention provides a continuous-time tunable Gm-C architecture for a $\Delta\Sigma$ modulator that can implement both lowpass and bandpass filters, compensate for processing variations, and dynamically track changes in the signal spectrum's carrier frequency while maintaining a high quality factor, a wide tuning bandwidth, a stable common mode operating point, and a high SNR.

This is accomplished with a Gm-C architecture that includes a tunable resonator and a low bit, high sample rate quantizer connected in a feedback loop. Oversampling expands the bandwidth of the $\Delta\Sigma$ modulator so that the signal spectrum occupies only a portion of the total bandwidth. The resonator shapes the quantizer's otherwise uniform quantization noise spectrum so that the bulk of the quantization noise occurs outside the signal spectrum. A tunable Gm cell tunes the resonator's resonant frequency to the signal spectrum's carrier frequency to maximize the modulator's SNR.

The tunable Gm cell includes a fixed Gm cell having transconductance $G_f$, a current divider and a recombination circuit that together effectively multiply $G_f$ by a factor $\alpha$, where $-1 <= \alpha <= 1$, without affecting the cell's common mode current $I_{cm}$. An alternate embodiment of the tunable Gm cell has a reduced transconductance range and reduced distortion. A positive current source supplies $I_{cm}$, while maintaining a common mode resistance of R/2 and a theoretically infinite differential mode resistance. Thus, the resonator's resonant frequency can be varied from DC to approximately 1 Ghz while maintaining a stable common mode operating point and improving the modulator's quality factor.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 8a and 8b are single and differential ended equivalent circuit representations, respectively, of a preferred positive current source that is included in the circuit shown in FIG. 1;

FIG. 9 is a schematic diagram of the positive current source shown in FIG. 8;

DETAILED DESCRIPTION OF THE INVENTION

The present invention provides a dynamically tunable continuous-time $\Delta\Sigma$ modulator that is implemented with a Gm-C resonator architecture. The $\Delta\Sigma$ modulator includes a tunable Gm cell whose transconductance $G_T = \alpha G_f$ can be varied from $-G_f$ to $+G_f$ by controlling the tuning factor $\alpha$ without effecting the common mode current $I_{cm}$, and a positive current source having a common mode resistance of R/2 and a theoretically infinite differential mode resistance that supplies $I_{cm}$. In practice the differential mode resistance can be several orders of magnitude larger than the common mode resistance. A modification of the Gm cell provides better signal dynamic range over a reduced transconductance range.

This architecture allows the noise shaping characteristics of the $\Delta\Sigma$ modulator to be dynamically tuned to 1) select a LPF or BPF architecture with resonant frequencies ranging from DC to approximately 1 Ghz with current processing technology, 2) compensate for processing errors to match the resonant frequency to the signal carrier frequency, and 3) compensate the $\Delta\Sigma$ modulator to changing signal properties such as found in Spread Spectrum applications. The $\Delta\Sigma$ modulator is typically used in ADCs, but can also be used in digital-to-analog converters (DACs), signal detectors, and pulse code modulators. This architecture provides approximately two orders of magnitude improvement in bandwidth, 20 dB SNR improvement, and approximately an order of magnitude increase in quality factor over known architectures.

Figure 1:
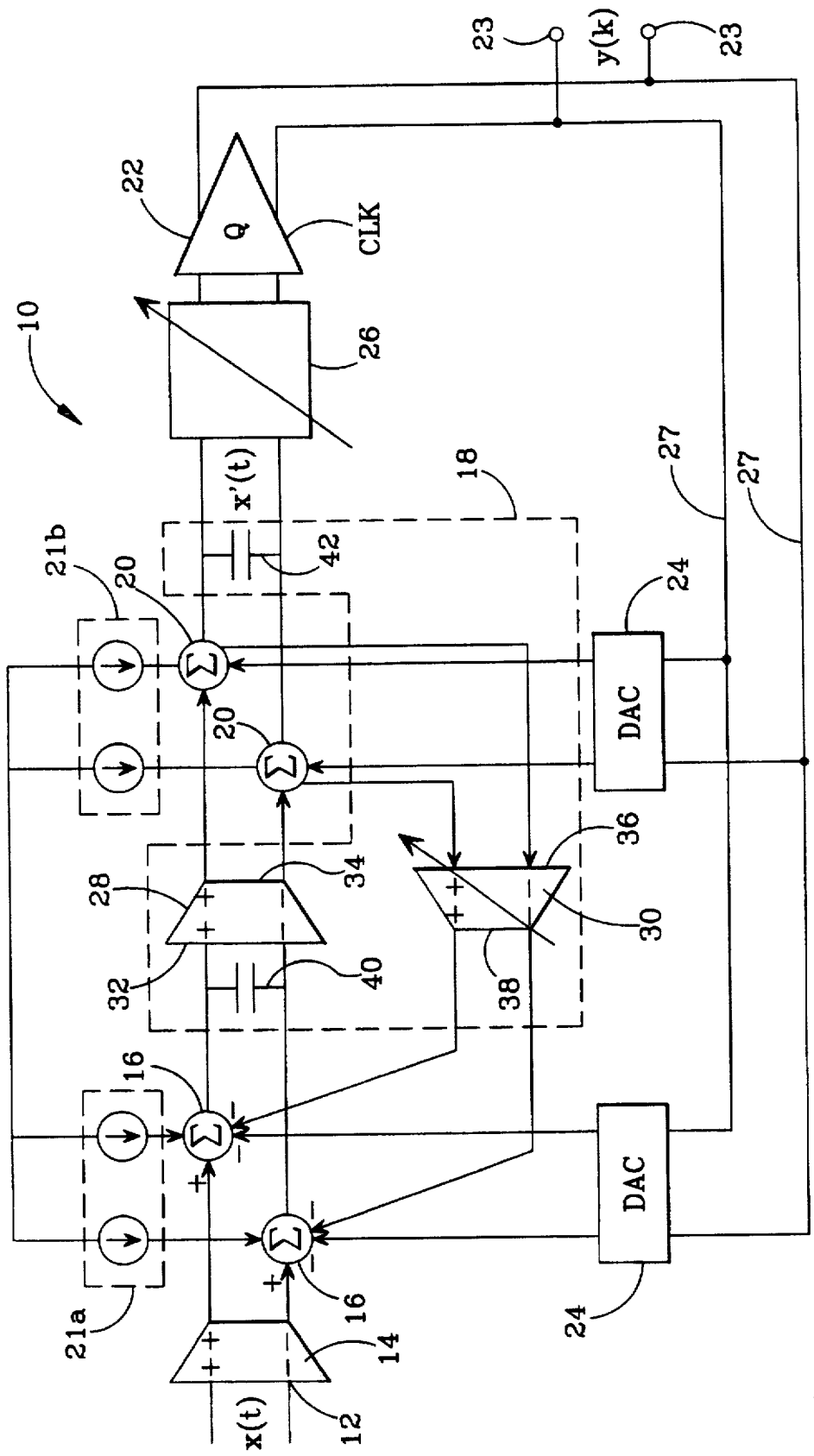
FIG. 1 is a schematic diagram of a dynamically tunable second order continuous time $\Delta\Sigma$ modulator that employs the invention.

FIG. 1 shows a second order continuous-time dynamically tunable $\Delta\Sigma$ modulator 10 that is implemented with a tunable Gm-C resonator architecture in accordance with the present invention. A time varying differential analog voltage signal x(t), which occupies a known portion of the available bandwidth, is applied to the differential input 12 of a Gm cell 14. The cell 14 converts the signal into a differential analog current signal at a first pair of current summing nodes 16. The current signal is driven into a tunable resonator 18, which integrates and converts the current into a differential analog voltage signal x'(t) across a second pair of current summing nodes 20. A pair of positive current sources 21a and 21b supply common mode current at the first and second pairs of current summing nodes 16 and 20, respectively, which establishes a common mode voltages at the nodes.

A low bit quantizer 22 oversamples x'(t) and outputs a digital voltage signal y(k) at a pair of output terminals 23. The quantizer 22, preferably 1-bit, samples x'(t) at a frequency of $kf_s$, where $f_s$ is the Nyquist rate and k is the oversampling ratio, typically between 4X and 128X. The output voltage y(k) is converted into an analog current level and negatively fed back to the first and second summing nodes, where it is held until the next clock cycle. The conversion is preferably accomplished using two 1-bit current steering DACs 24, which accurately generate reproducible binary current levels. A variable delay 26 is connected between the resonator 18 and the quantizer 22 to add a negative phase delay to offset the positive phase delay induced by the quantizer 22 and stabilize the feedback path 27.

The tunable resonator 18 includes a fixed Gm cell 28 having transconductance G1 and a tunable Gm cell 30 having variable transconductance $G_T=\alpha G_f$, where $G_f$ is the transconductance of a fixed Gm cell, with the cells 28 and 30 connected in antiparallel, i.e. the cells' inverting and non-inverting outputs are connected to the other cells' inverting and non-inverting inputs, respectively. The fixed Gm cell's differential input 32 and differential output 34 are connected to the first and second pairs of current summing nodes 16 and 20, respectively. The tunable Gm cell's differential input 36 and differential output 38 are connected to the second and first pairs of current summing nodes 20 and 16, respectively, in a negative feedback configuration. A capacitor 40 having capacitance C1 is connected across the first pair of current summing nodes 16 to integrate their differential current and produce a voltage across the differential input 32 to drive the fixed Gm cell 28. A capacitor 42 having capacitance C2 is connected across the second pair of current summing nodes 20 to integrate their differential current and produce the voltage x'(t) that is input to the variable delay 26. In this configuration, the resonator 18 has a frequency response:

$$H(s) = \frac{s}{s^2 + \omega_0^2} \qquad (2)$$

where the resonant frequency is equal to $\omega_0 = [(G1G_T)/(C1C2)]^{0.5}$. The resonator's resonant frequency is varied from DC to an upper frequency limit by varying $G_T$ from 0 to $+G_f$. Current processing technologies provide an upper frequency limit of approximately 1 Ghz.

The $\Delta\Sigma$ modulator 10 has an output spectrum Y(s) given by:

$$Y(s) = \frac{X(s)}{s^2 + as + b} + \frac{Q(s)(s^2 + \omega_0^2)}{s^2 + as + b} \qquad (3)$$

where X(s) is the spectrum of the input signal x(t) and Q(s) is the quantization noise spectrum. The input spectrum X(s) occupies the known portion of bandwidth. Outside the known bandwidth the amplitude of the input spectrum X(s) is reduced to approximately zero. The quantization noise spectrum Q(s) is distributed approximately uniformly from DC to $kf_s$. The coefficients a and b are time varying functions of the capacitances C1 and C2 and transconductances G1 and $G_T$. They result from the nonlinearity of the quantizer, but are not significant in the analysis of the modulator.

As indicated in equation 3, the quantization noise spectrum Q(s) is shaped by a band-stop filter so that the output noise spectrum $$N(s) = \frac{Q(s)(s^2 + \omega_0^2)}{s^2 + as + b}$$

has a zero at the resonant frequency $\omega_0$. The tunable Gm cell is tuned to position the resonant frequency $\omega_0$, and hence the zero in the noise spectrum N(s), to minimize the quantization noise that occurs in the signal bandwidth portion of the output spectrum Y(s). In a BPF configuration, the resonant frequency is preferably tuned to the center frequency of the input spectrum X(s). For example, if the input signal is symmetrically modulated about a single carrier frequency, the resonant frequency is tuned to the carrier frequency. If the Gm cell 30 is tuned so that its transconductance $G_T=0$, the frequency response H(s) simplifies to 1/s, which is the response of an integrator. Thus, the architecture can implement both LPF and BPF, which remove quantization noise by high pass filtering and band stop filtering, respectively. In a LPF configuration, the resonant frequency may be offset from DC to optimize the SNR.

As also indicated in equation 3, the input spectrum X(s) is shaped by a LPF. As a result, the amplitude of the signal component is reduced at higher frequencies. To improve the SNR at high frequencies, the input signal x(t) can be fed forward to the input of the resonator 18 so that the input spectrum X(s) is band pass filtered instead of low pass filtered. The feedforward coefficients are tuned so that the BPF's resonant frequency also tracks the center frequency. As a result, the BPF frequency response is a maximum at the center frequency.

Figure 2:
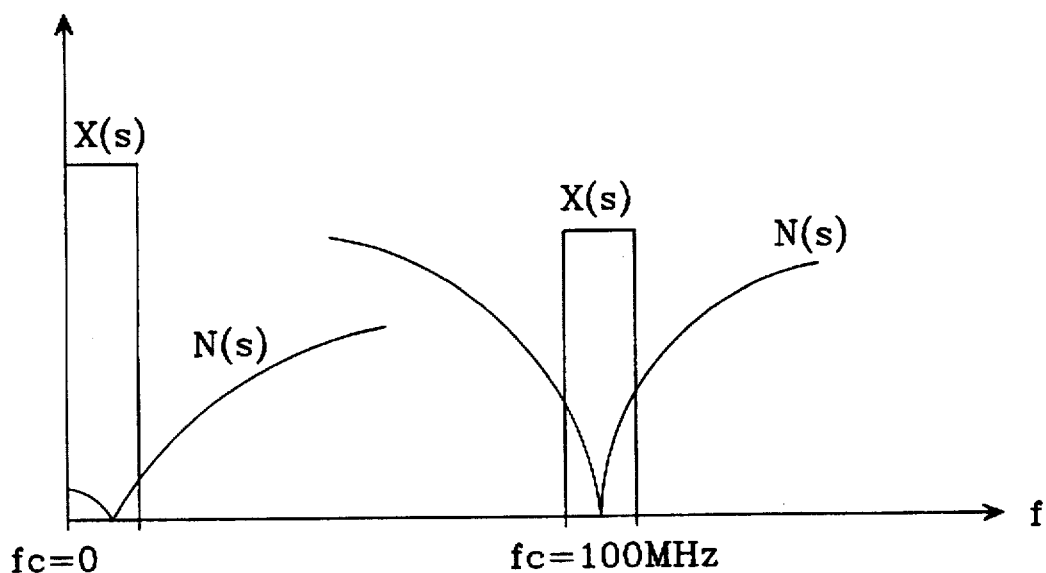
FIG. 2 is a plot of the signal and noise spectrums as a function of frequency for the $\Delta\Sigma$ modulator of FIG. 1.

As shown in FIG. 2, when the input spectrum X(s) includes DC, the output noise spectrum N(s) is shaped so that the noise is effectively high pass filtered. Optimally, the zero in the noise spectrum N(s) is not placed at DC as it would be in a true LPF architecture, but is shifted to the middle of the signal bandwidth. This produces a marginally better SNR. When the center frequency of the input spectrum X(s) is, for example, 100 Mhz, the output noise spectrum N(s) is shaped so that the noise is effectively band-stop filtered. The filter's resonant frequency is preferably matched to the center frequency to reduce the amount of noise in the signal spectrum. The ability to accurately tune the resonant frequency improves the modulator's SNR by approximate 20 dB.

Figure 3:
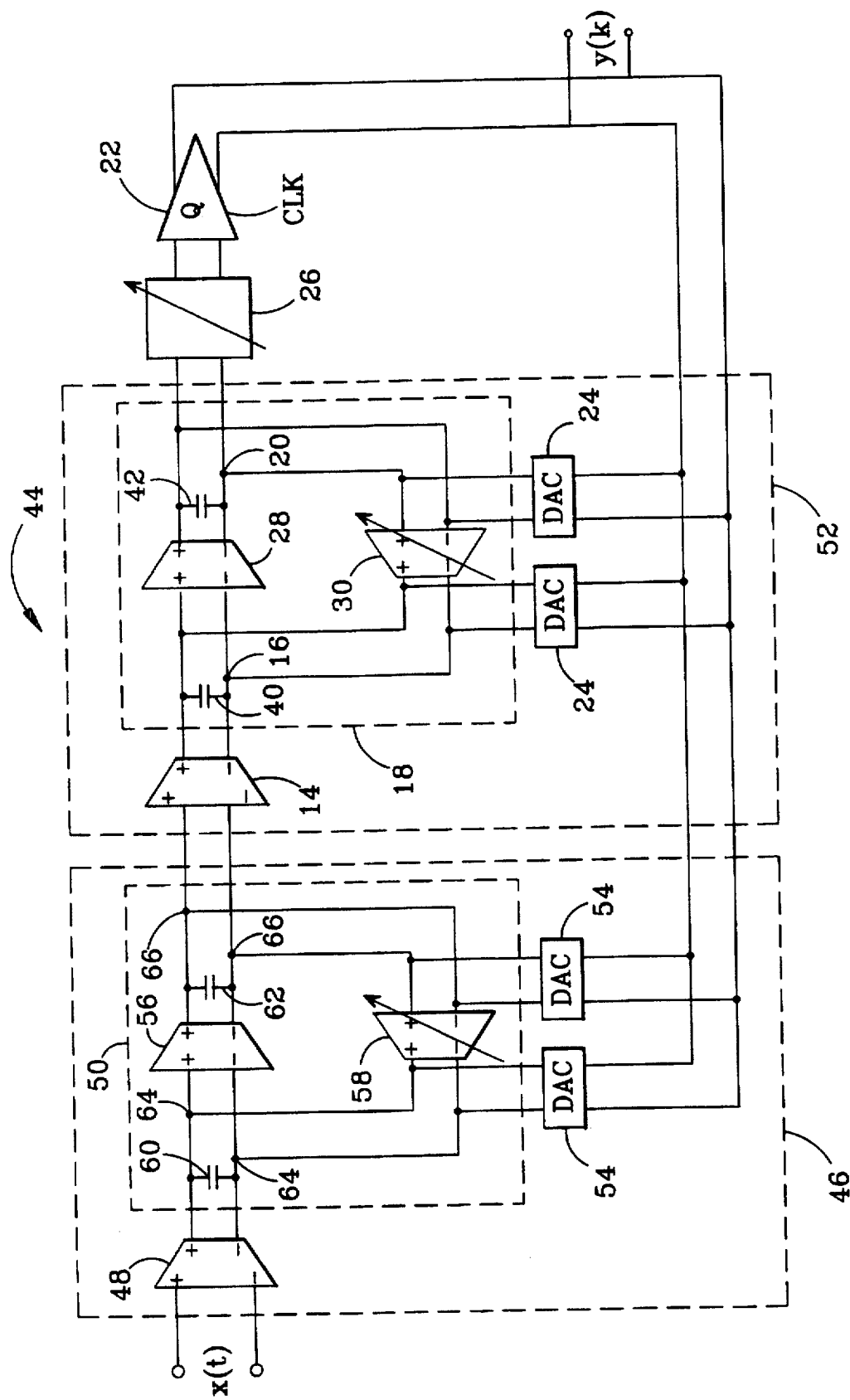
FIG. 3 is a schematic diagram of a dynamically tunable fourth order continuous time $\Delta\Sigma$ modulator.

As shown in FIG. 3, a fourth order $\Delta\Sigma$ modulator 44 is implemented by placing an additional resonator circuit 46 in cascade with the $\Delta\Sigma$ modulator 10 shown in FIG. 1. The resonator circuit 46 includes a fixed Gm cell 48 for converting the input signal x(t) into a current signal, a tunable resonator 50 for integrating and converting the current signal into a voltage signal to drive the second stage resonator circuit 52, and a pair of 1-bit DACs 54 for feeding the output signal y(k) back to the tunable resonator 50. The tunable resonator 50 includes a fixed Gm cell 56 and a tunable Gm cell 58 having respective transconductances G3 and $G_{T2}$, and capacitors 60 and 62 having respective capacitances C3 and C4, which are connected around third and fourth pairs of current summing nodes 64 and 66, respectively, in the same circuit topology as the tunable resonator 18.

In this configuration, the tunable resonator 50 has a frequency response:

$$H(s) = \frac{s}{s^2 + \omega_1^2} \qquad (4)$$

where the resonant frequency is equal to $\omega_1 = [(G3G_{T2})/(C3C4)]^{0.5}$. The resonator's resonant frequency is varied from DC to approximately 1 Ghz by varying $G_{T2}$ from 0 to $+G_f$. The fourth-order $\Delta\Sigma$ modulator 44 has an output spectrum Y(s) given by:

$$Y(s) = \frac{X(s)}{(s^2 + as + b)(s^2 + cs + d)} + \frac{Q(s)(s^2 + \omega_0^2)(s^2 + \omega_1^2)}{(s^2 + as + b)(s^2 + cs + d)} \qquad (5)$$

As indicated in equation 5, the quantization noise spectrum Q(s) is shaped by a fourth order band-stop filter having zeroes at $\omega_0$ and $\omega_1$ to generate the output noise spectrum N(s). The tunable Gm cells 30 and 58 can be tuned so that their resonant frequencies are equal, thereby producing a band-stop filter that has a sharper transition between the stop and pass bands. Alternately, the cells can be tuned to split the zeroes in the output noise spectrum N(s) to reduce the noise over the entire bandwidth of the signal spectrum. Higher order modulators can be realized by adding additional resonator circuits in cascade.

Figure 4:
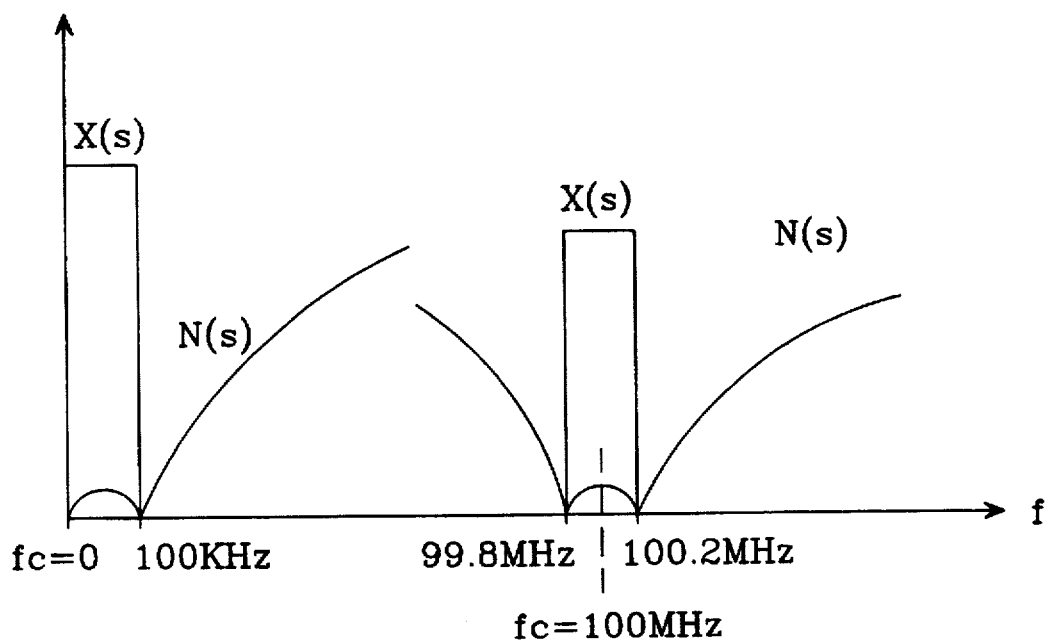
FIG. 4 is a plot of the signal and optimized noise spectra as a function of frequency for the $\Delta\Sigma$ modulator of FIG. 3.

As shown in FIG. 4, the resonant frequencies are split and tuned so that the zeroes in the noise spectrum N(s) occur at the low and high frequencies in the signal spectrum X(s). This reduces the amplitude of the noise spectrum N(s) across the entire bandwidth of the signal spectrum X(s). For example, when the signal spectrum X(s) has a bandwidth of 100 Khz and center frequency at DC, one resonant frequency is tuned to DC and the other resonant frequency is tuned to 100 Khz. Similarly, when the signal spectrum X(s) has a bandwidth of 400 Khz and a center frequency of 100 Mhz, the resonant frequencies are tuned to 99.8 Mhz and 100.2 Mhz, respectively.

Figure 5:
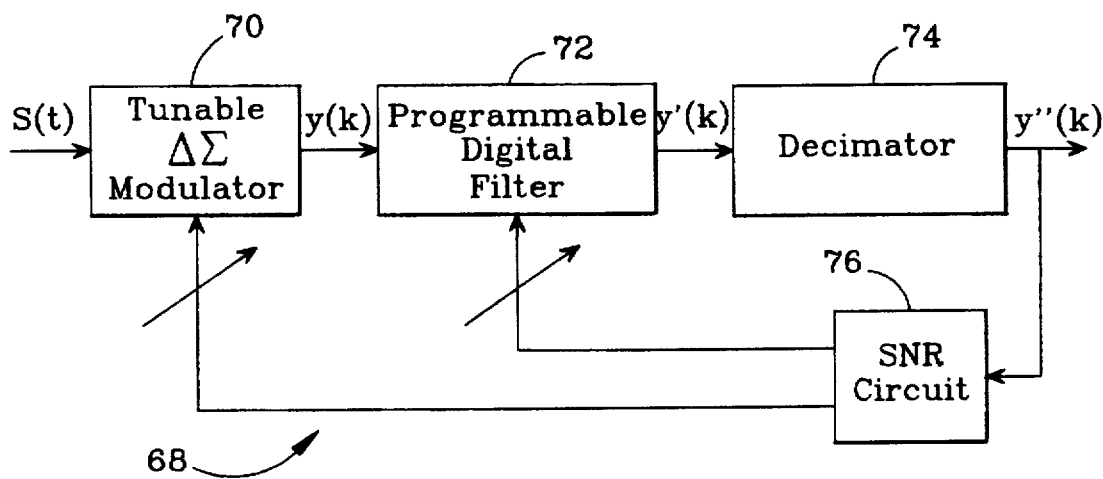
FIG. 5 is a block diagram of an ADC implementation for a spread spectrum input signal.

As shown in FIG. 5, a dynamically tunable ADC 68 can be implemented using a tunable $\Delta\Sigma$ modulator 70 of the type shown in FIGS. 1 and 3 to digitize a spread spectrum input signal s(t) whose carrier frequency varies with time, while maintaining a high SNR. The $\Delta\Sigma$ modulator 70 is tuned to the carrier frequency and outputs a digital signal y(k). A programmable digital filter 72, preferably a finite impulse response (FIR) filter, is also tuned to the carrier frequency so that it passes the signal spectrum and rejects the out-of-band quantization noise to generate a digital signal y'(k) at the oversampled rate of $kf_s$. A decimator 74 digitally resamples the filtered digital signal to remove the redundant signal information introduced by the oversampling process and output a lower rate signal y"(k).

A SNR circuit 76 continuously computes the SNR of the output signal y"(k), and adjusts the resonant frequencies of the modulator 70 and the filter 72 to track the time-variance of the input signal's carrier frequency and thereby maintain a high SNR. The modulator's resonant frequencies are tuned by varying the respective transconductances G2 and G4. The digital filter is tuned by reloading the filter with a set of filter coefficients designed for the current carrier frequency. In practice, a plurality of coefficient sets at discrete carrier frequencies will be predesigned and stored in memory. During operation, the set of coefficients closest to the current carrier frequency will be selected.

Figure 6:
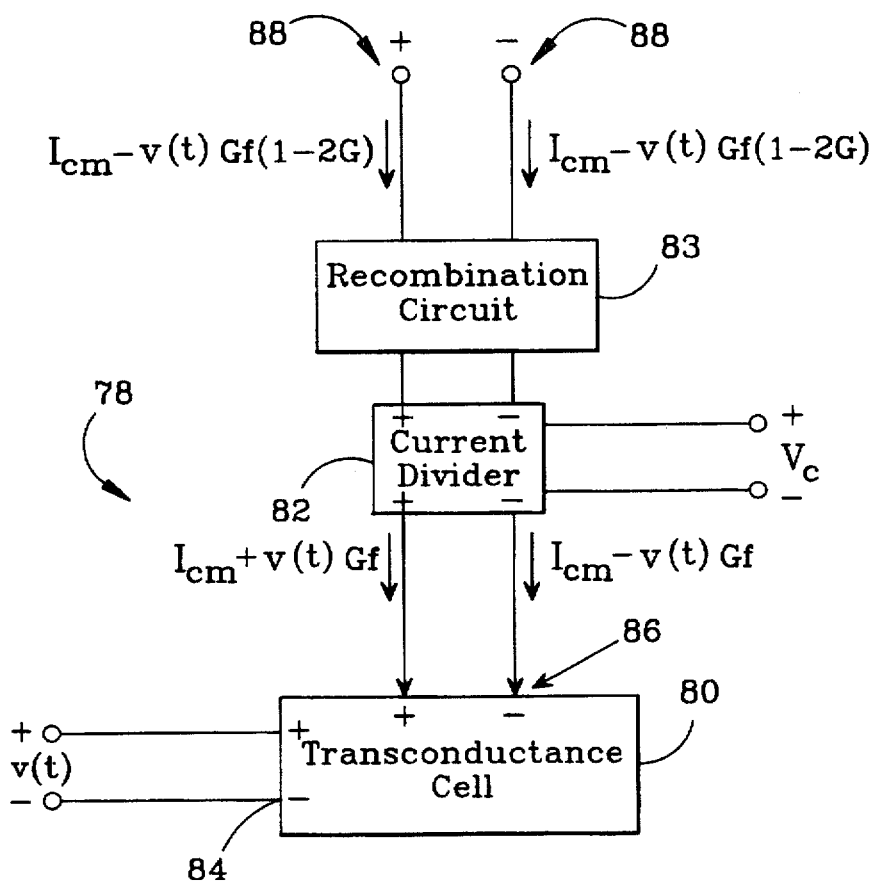
FIG. 6 is a block diagram of a preferred tunable Gm cell that is included in the circuit shown in FIG. 1.

As shown in FIG. 6, a tunable Gm cell 78 of the type shown in FIGS. 1 and 3 includes a fixed Gm cell 80 that has transconductance $G_f$. The application of a differential voltage signal v(t) to the Gm cell's differential input 84 produces a differential mode current signal $\pm v(t)G_f$ that is imposed on the common mode current signals $I_{cm}$ at its differential output 86. A current divider 82 varies the cell's transconductance by splitting the current signals into two pair of branches and routing the current from one branch in each pair to the current divider's differential output. The apportionment of current between the two branches, and hence $\alpha$, is set by a control voltage $V_c$. At this point, both the common mode and differential mode signals are a function of $\alpha$. To remove the common mode signal's dependency on $\alpha$, the portion of the common mode signal that was removed by the current divider is added back into the signal path by a recombination circuit 83 so that the differential mode current signals $\pm v(t)G_f$ are scaled by $\alpha$ and the common mode current signals $I_{cm}$ are independent of $\alpha$.

The recombination circuit 83 is preferably implemented (as shown in detail in FIG. 7) by cross-coupling the second branches in each pair to the differential output 88. This both removes the $\alpha$ dependency and doubles the effect of splitting the current, which allows $\alpha$ to range from +1 to −1. Alternately, the same effect can be accomplished by providing another Gm cell and current divider that are driven by the same voltage signal v(t) and control voltage Vc and cross-coupling that current divider's second branches to the differential output 88. However, this requires twice the number of components and may not completely eliminate the common mode signal's dependence on $\alpha$ if there is any mismatch between the components. In the alternate embodiment, the second Gm cell can be eliminated with the only effect being that $\alpha$ is constrained to lie between 0 and +1.

Figure 7:
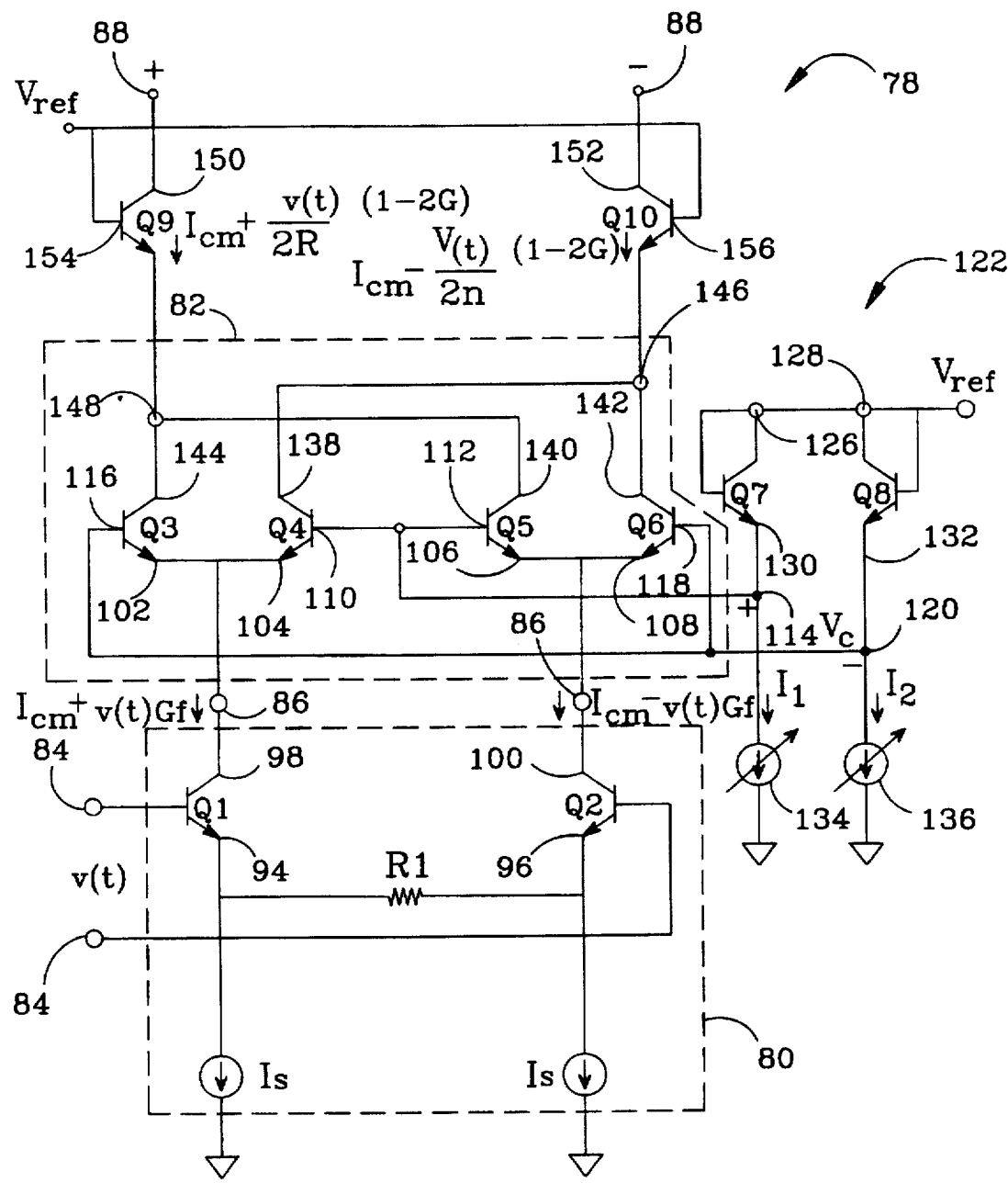
FIG. 7 is a schematic diagram of the tunable Gm cell shown in FIG. 6.

As shown in FIG. 7, the tunable Gm cell 78 is preferably implemented in an all NPN bipolar architecture, which increases the cell's bandwidth. The Gm cell 80, which is of the type used both in the tunable Gm cell as well as the fixed Gm cells, includes a pair of transistors Q1 and Q2 whose emitters 90 and 92, respectively, are connected to opposite sides of a resistor R1 having a resistance 2R. A pair of biasing current sources Is are connected between the emitters 90 and 92, respectively, and a low supply voltage Vee, typically ground. The current sources Is sink the common mode current $I_{cm}$ that flows through the transistors Q1 and Q2.

The voltage v(t) is applied differentially at the input 84 across the base contacts 94 and 96 of transistors Q1 and Q2, respectively. This produces a voltage v(t) across resistor R1 such that currents $I_{Q1}(t)=I_{cm}+v(t)/2R$ and $I_{Q2}(t)=I_{cm}-v(t)/2R$ flow through the collectors 98 and 100 of transistors Q1 and Q2, respectively. The transconductance $G_f$ of the cell 80 is approximately given by: $G_f=(I_{Q1}(t)-I_{Q2}(t))/v(t)=1/R$.

The current divider 82 comprises two pair of differentially connected NPN transistors Q3, Q4 and Q5, Q6. The emitters 102 and 104 of transistors Q3 and Q4 are connected and together supply the tail current $I_{cm}+v(t)/2R$ to the collector 98 of transistor Q1, and the emitters 106 and 108 of transistors Q5 and Q6 are connected and together supply the tail current $I_{cm-v(t)}/2R$ to the collector 100 of transistor Q2. The bases 110 and 112 of transistors Q4 and Q5 are connected to a positive voltage node 114, and the bases 116 and 118 of Q3 and Q6 are connected to a negative voltage node 120.

The control voltage Vc is applied differentially to the negative and positive nodes 120 and 114 to control the transistors' base-emitter voltages such that transistors Q4 and Q5 conduct G times their respective tail currents and transistors Q3 and Q6 conduct (1-G) times their respective tail currents where $0 \leq G \leq 1$. When Vc is large and positive G approaches 1 so that transistors Q4 and Q5 conduct substantially all of their respective tail currents. Conversely when Vc is large and negative G approaches 0 so that transistors Q3 and Q6 conduct substantially all of their respective tail currents. When Vc=0, G=½ and the transistors are balanced.

A current controlled circuit 122 generates the control voltage $V_c$ to select the value of G. The circuit 122 includes a pair of diode connected NPN transistors Q7 and Q8 whose respective base-collector junctions 126 and 128 are tied to a reference voltage Vref. Their emitters 130 and 132 are connected to the positive and negative voltage nodes 114 and 120, respectively. Variable current sources 134 and 136 supply currents I1 and I2 that flow through transistors Q7 and Q8, respectively, so that the control voltage $V_c$ is given by:

$$V_c = V_t \ln\left(\frac{I2}{I1}\right) \quad (6)$$

The splitting fraction G varies between 0 and 1 in response to the control voltage $V_c$ according to the following relation:

$$G = \frac{e^{V_c/V_t}}{1 + e^{V_c/V_t}} \quad (7)$$

Substituting the representation for $V_c$ in equation 6 into equation 7 gives:

$$G = \frac{I2}{I1 + I2} \quad (8)$$

Thus, the tuning factor $\alpha=(1-2G)$ can be easily and accurately controlled by varying the supply currents I1 and I2.

To remove the common mode currents dependency on $\alpha$ and implement the recombination circuit 83 as shown in FIG. 6, the collectors 138 and 140 of transistors Q4 and Q5 are cross-coupled to the collectors 142 and 144 of transistors Q6 and Q3 at current summing nodes 146 and 148, respectively. The current flowing into node 148 is $(1-G)(I_{cm}+v(t)/2R)+G(I_{cm}-v(t)/2R)$, which equals $I_{cm}+(v(t)/2R)(1-2G)$. Similarly the current flowing into node 146 is $I_{cm}-(v(t)/2R)(1-2G)$.

The output impedance of the Gm cell 78 looking into nodes 146 and 148 is the parallel combination of the resistances of transistors Q6 and Q4, and of the transistors Q3 and Q5, respectively. To increase the cell's output impedance, a pair of cascode transistors Q9 and Q10 are connected such that their current circuits 150 and 152 conduct current from nodes 148 and 146, respectively, to the cell's differential output 88. Their bases 154 and 156 are connected to the reference voltage Vref. Thus, the output impedance looking into the differential outputs 88 is the resistance of transistors Q9 and Q10.

The transconductance $G_T$ of the tunable Gm cell 78 is the differential output current divided by the input voltage signal, and is approximately given by:

$$G_T = \frac{1}{R}(1 - 2G) \quad (9)$$

where 1/R is the approximate fixed transconductance $G_f$ of Gm cell 80 and (1–2G) is the factor $\alpha$. Thus, the tunable transconductance $G_T$ is given by:

$$G_T = \alpha G_f \quad (10)$$

As a result, the transconductance $G_T$ can be accurately varied from $-G_f$ to $+G_f$ to select the desired noise filter, tune the resonant frequency to compensate for processing variations, and to track fluctuations in the center frequency, while maintaining a high differential mode impedance. Furthermore, the common mode current $I_{cm}$ that flows into the Gm cell 78 is independent of the tuning factor $\alpha$. Thus, the resonant cell's resonant frequency can be tuned over the modulator's entire bandwidth.

FIGS. 8a and 8b are equivalent single and differential ended circuit representations of a positive current source (PCS) 158 of the type shown in FIG. 1 which supplies the common mode current $I_{cm}$ required to drive the fixed Gm cells 14 and 28 and tunable Gm cell 30. As shown in FIG. 8a, the PCS 158 includes a pair of unity gain single-ended inverting amplifiers 160 and 162 that are connected in anti-parallel across a pair of matched resistors R2 and R3 having resistance $R_0$ at output terminals 164 and 166, respectively. As shown in FIG. 8b, the PCS 158 includes a unity gain differential amplifier 163 whose non-inverting and inverting inputs are connected to output terminals 164 and 166, respectively. The resistors R2 and R3 are connected across the non-inverting and inverting sides of amplifier 163.

A constant voltage V1 is applied across the resistors R2 and R3 to supply the common mode current $I_{cm}$ at output terminals 164 and 166. A change in the common mode voltage $\Delta v$ at output terminals 164 and 166 produces a voltage change across the resistors of $2\Delta v$. Thus, the PCS has a common mode impedance of $R_0/2$, which is small enough to maintain a stable common mode operating point with process variations providing minimal impact. A change in the differential mode voltage of $+\Delta v$ at terminal 164 and of $-\Delta v$ at terminal 166 does not effect the voltage across resistors R2 and R3. Thus, the PCS has an ideal differential mode impedance of infinity. In practice, the differential mode impedance can be several orders of magnitude larger than the common mode impedance, which allows us to maintain a high Q.

FIG. 9 illustrates an NPN circuit topology for the PCS 158 shown in FIG. 8a and 8b. The inverting amplifier 160 (one side of the differential amplifier 163) includes NPN transistors Q11 and Q12, which are connected as an emitter follower and a degenerated common-emitter inverting amplifier, respectively. Transistor Q11's base 168 is connected at output terminal 164, its collector 170 is tied to a high supply voltage Vcc, and its emitter 172 is connected to a current source Is1. Transistor Q12's base 174 is connected to emitter 172, its collector 176 is connected to a resistor R4, and its emitter 178 is connected to a resistor R5. The other side of resistor R4 is tied to the supply voltage Vcc and the other side of resistor R5 (which is at virtual ground) is connected through a current source Is2 to the low supply voltage Vee. The amplifier's output voltage is taken at transistor Q12's collector 176 and is applied to the base 179 of an emitter follower buffer transistor Q13. Q13's collector 180 is tied to the positive supply voltage Vcc and its emitter 181 is connected to resistor R3.

A voltage change of $+\Delta v$ at the base 168 of transistor Q11 increases the voltage across resistor R5. This increases the current flowing through resistors R5 and R4, which reduces the amplifier's output voltage at Q12's collector 176. This in turn reduces the voltage at Q13's emitter 181. The inverting amplifier 160 and level shifting transistor Q13 together must have unity gain to achieve infinite differential mode resistance. Ideally, the emitter follower transistors Q11 and Q13 and inverting amplifier transistor Q12 have unity gain. However, their gains are typically slightly less than 1. Thus, to achieve high differential mode impedance the resistance of R4 is set to be greater than the resistance of R5.

The unity gain inverting amplifier 162 (the other side of differential amplifier 163) is identical to amplifier 160 and includes NPN transistors Q14 and Q15, which are connected as an emitter follower and a degenerated common-emitter inverting amplifier, respectively. Transistor Q14's base 182 is connected at output terminal 166, its collector 183 is tied to the high supply voltage Vcc, and its emitter 184 is connected to a current source Is3. Transistor Q15's base 186 is connected to emitter 184, its collector 188 is connected to a resistor R6, and its emitter 190 is connected to a resistor R7. The other side of resistor R6 is tied to the supply voltage Vcc and the other side of resistor R7 (which is at virtual ground) is connected through the current source Is2 to the low supply voltage Vee. The amplifier's output voltage is taken at transistor Q15's collector 188 and is applied to the base 192 of an emitter follower buffer transistor Q16. Q16's collector 194 is tied to the positive supply voltage Vcc and its emitter 196 is connected to resistor R2. To achieve high differential mode impedance, the resistance of R6 is set greater than the resistance of R7.

A change in the common mode voltage changes the voltages at the bases of transistors Q11 and Q14 by the same amount Δv. As a result, the voltage across resistors R2 and R3 changes by 2Δv so that the common mode impedance seen at output terminals 164 and 166 is R/2. A change in the differential mode voltage drives the voltages at the bases of transistors Q11 and Q12 in opposite directions by +Δv and Δv, respectively. As a result, the voltage across the resistors R3 and R4 ideally does not change, and the differential mode impedance is infinite. In practice, the differential mode impedance is limited by the ability to set the amplifiers' gain to exactly unity.

Figure 10:
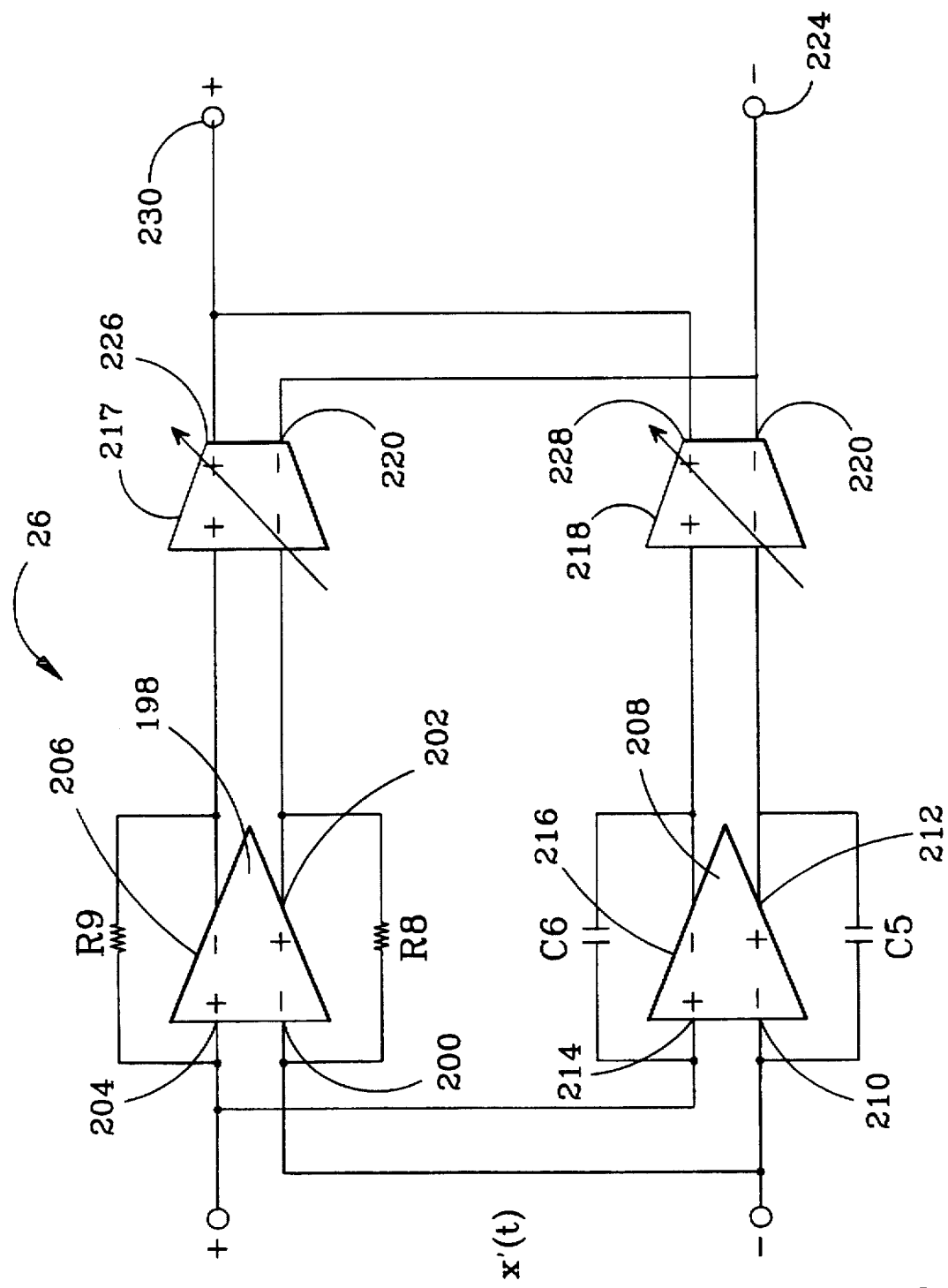
FIG. 10 is a schematic diagram of a preferred variable delay circuit that is included in the circuit shown in FIG. 1.

The simplest method of compensating for excess phase shift in the modulator's feedback loop is to add a resistor in series with the integration capacitors. FIG. 10 illustrates a preferred embodiment of the variable delay 26 shown in FIG. 1. The variable delay 26 includes a differential amplifier 198 that has a pair of resistors R8 and R9 respectively connected between the amplifier's inverting input 200 and non-inverting output 202 and the amplifier's non-inverting input 204 and inverting output 206, and a differential amplifier 208 that has a pair of capacitors C5 and C6 respectively connected between the amplifier's inverting input 210 and non-inverting output 212 and the amplifier's non-inverting input 214 and inverting output 216. The positive side of the integrated voltage signal x'(t) is driven into the amplifiers' non-inverting inputs 204 and 214, and the negative side of x(t) is applied to the amplifiers' inverting inputs 200 and 210. The amplifiers' outputs are driven into tunable Gm cells 216 and 218, respectively. The Gm cells' inverting outputs 220 and 222 are combined at a negative terminal 224 and driven into the negative side of the quantizer 22 shown in FIG. 1. Similarly, the Gm cells' inverting outputs 226 and 228 are combined at a positive terminal 230. The tunable Gm cells' transconductances are varied from $-G_f$ to $+G_f$ to add a phase delay to x'(t) that is between −180° and +180° to stabilize the feedback loop. For example, if the transconductance of Gm cell 216 is set to zero and the transconductance of cell 218 is positive, the impedance of the variable delay is purely capacitive, and thus the phase delay is 90°. If the transconductance of Gm cell 216 is positive and the transconductance of cell 218 is set to zero, the impedance of the variable delay is purely resistive, and thus the phase delay is 0°.

Figure 11:
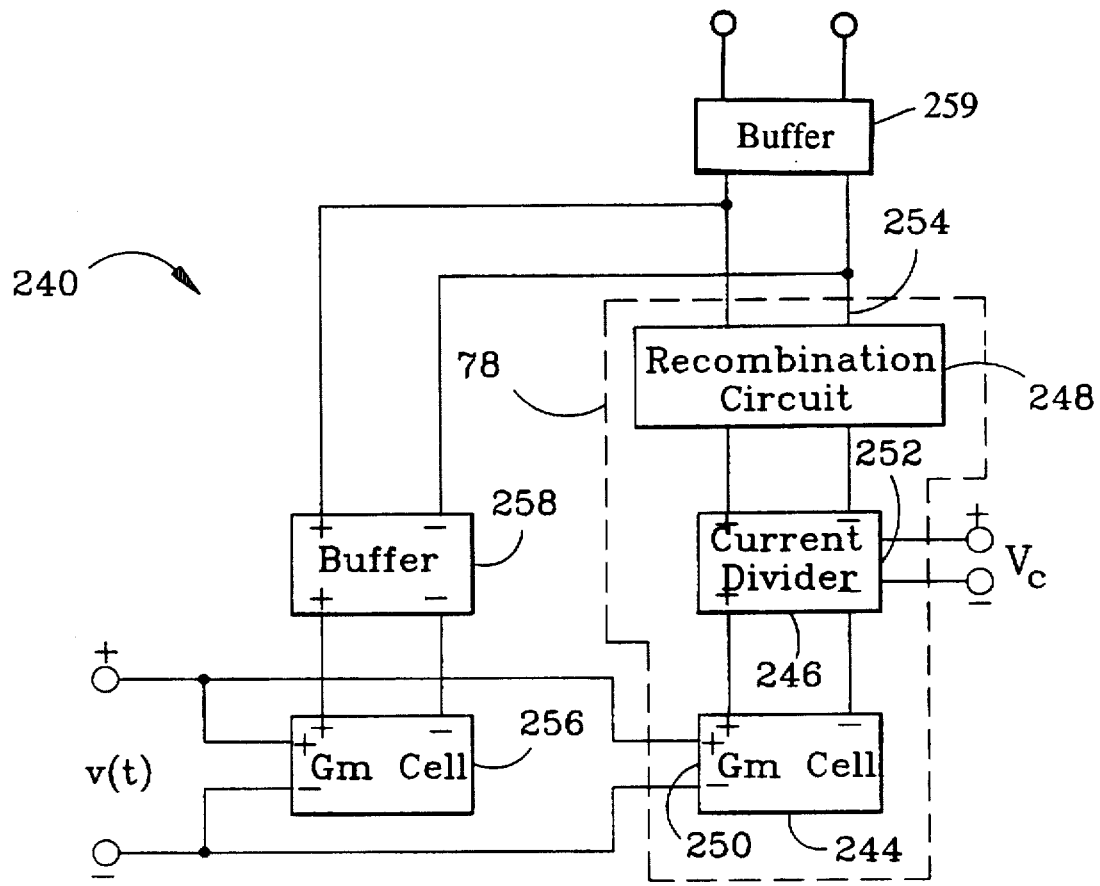
FIG. 11 is a block diagram of an alternate embodiment of the tunable Gm cell.

FIG. 11 illustrates an alternate tunable Gm cell 240 that has a limited transconductance range but which reduces non-idealities in the current divider. The Gm cell 240 includes a tunable Gm cell 242 of the type shown in FIG. 6. The Gm cell 242 includes a fixed Gm cell 244 having transconductance Gm1, a current divider 246 and a recombination circuit 248. The tunable Gm cell 242 responds to the application of a voltage signal v(t) at the fixed Gm cell's differential input 250 and a control voltage signal Vc at the current divider's input 252 to produce a variable transconductance ±Gm1 at the recombination circuit's differential output 254. The Gm cell 240 includes another fixed Gm cell 256 having transconductance Gm2 and a buffer 258 that are connected in series between the voltage signal v(t) and the recombination circuit's differential output 254. The buffer 258 is suitably a cascode pair of npn transistors that match the delay and output impedance of the current divider 246. A buffer 259 (a cascoded pair of npn transistors) is used to increase the cell's output impedance. As a result, the total transconductance seen at the differential output 254 is Gm2±Gm1. Because only a portion of the total output current passes through the current divider 246 and non-idealities are reduced. For example, if Gm1=Gm2=½Gf the total transconductance will range from 0 to Gf and only one-half of the total output current is subject to any noise and/or distortion in the current divider 246.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A tunable Delta Sigma (ΔΣ), modulator comprising:

an input transconductance cell that converts an analog voltage signal, which has a signal spectrum that occupies a known bandwidth, into an analog current signal at a first summing node;

a tunable resonator that is connected to the first summing node and generates an integrated voltage signal at a second summing node;

a quantizer that oversamples the integrated voltage signal and converts it into a digital output voltage signal, said output voltage signal having an output spectrum that is the sum of the signal spectrum and a quantization noise spectrum;

a feedback path which returns said digital output voltage signal to the first and second summing nodes; and a digital-to-analog converter (DAC) in the feedback path that converts said digital output voltage signal into reproducible current levels;

said tunable resonator having a resonant frequency $\omega_0$ that is tunable to shape the quantization noise spectrum to reduce the quantization noise in said output spectrum over the known bandwidth, said tunable resonator comprising:

a pair of integrating capacitors having capacitances C1 and C2 that are connected at the first and second summing nodes, respectively;

a fixed transconductance cell having transconductance G1 that is connected between the first and second summing nodes; and a tunable transconductance cell having a variable transconductance $G_T$ that is connected between the first and second summing nodes in an anti-parallel configuration with said fixed transconductance cell, said resonator having a frequency response H(s) of:

$$H(s) = \frac{S}{S^2 + \omega_0^2}$$

where $\omega_0 = [(G_1 G_T)/(C1 C2)]^{0.5}$.

2. The tunable ΔΣ modulator of claim 1, wherein said resonator conducts a pair of common mode currents that set common mode voltages at the first and second summing nodes, said tunable transconductance cell having a tunable transconductance $G_T$ and comprising:

a fixed transconductance cell having a transconductance $G_f$ that converts a voltage signal v(t) across the second integrating capacitor C2 into a differential mode current and imposes it onto the common mode currents;

a current divider that apportions the common mode currents in response to a control signal to scale the differential mode current; and a recombination circuit that restores the common mode currents so that the differential mode current is scaled by a factor α, the common mode currents are insensitive to α such that the common mode voltages are stable, and the tunable transconductance $G_T=\alpha G_f$.

3. The tunable ΔΣ modulator of claim 2, wherein said quantizer and said resonator introduce positive phase delay in the feedback path, said modulator further comprising an adjustable delay circuit at said second summing node for providing negative phase delay to stabilize the feedback path.

4. The tunable ΔΣ modulator of claim 3, wherein said integrated voltage signal is generated differentially and is applied to the adjustable delay circuit which comprises:
- a pair of differential amplifiers having inverting and non-inverting inputs and outputs, said differential amplifiers' inverting and non-inverting inputs being respectively connected together;
- a pair of resistors that are connected between the inverting input and non-inverting output and the non-inverting input and inverting output, respectively, of a first one of said differential amplifiers;
- a pair of capacitors that are connected between the inverting input and non-inverting output and the non-inverting input and inverting output, respectively, of a second one of said differential amplifiers; and
- a pair of tunable transconductance cells each having inverting and non-inverting inputs that are connected to the non-inverting and inverting outputs of respective differential amplifiers and each having inverting and non-inverting outputs that are connected together, respectively, said integrated voltage signal being generated across the cells' non-inverting and inverting outputs with a negative phase shift, said cells' transconductances being tuned to select the negative phase shift.

5. The tunable ΔΣ modulator of claim 2, wherein said resonator further comprises a pair of positive current sources (PCSs) that supply said common mode currents at said first and second summing nodes, respectively, each of said PCSs comprising a pair of unity gain inverting amplifiers that are connected in anti-parallel across a pair of resistors having resistance R to supply said common mode current, said PCS having a common mode impedance of approximately R/2 and a differential mode impedance approaching infinity.

6. The tunable ΔΣ modulator of claim 2, wherein said resonator further comprises a pair of positive current sources (PCSs) that supply said common mode currents at said first and second summing nodes, respectively, each of said PCSs comprising a differential unity gain inverting amplifier having inverting and non-inverting sides and a pair of resistors having resistance R that are connected across the amplifier's inverting and non-inverting sides, respectively, to supply said common mode current, said PCS having a common mode impedance of approximately R/2 and a differential mode impedance approaching infinity.

7. The tunable ΔΣ modulator of claim 2, further comprising a second input transconductance cell and a second tunable resonator connected in cascade with said input transconductance cell with said output voltage signal being fed back through said DAC to said second input transconductance cell and said second tunable resonator, said tunable resonator having a resonant frequency $\omega_1$, said first and second tunable resonators' resonant frequencies being tuned to shape the quantization noise spectrum to reduce the quantization noise across said signal spectrum.

8. The tunable ΔΣ modulator of claim 2, wherein said quantizer includes a binary comparator that formats said digital output voltage signal as a binary signal and said DAC includes a pair of binary current steering DACs that convert said binary signal into a pair of current signals that are returned to the first and second summing nodes, respectively.

9. A tunable Delta Sigma (ΔΣ) modulator comprising a tunable Gm-C resonator and a quantizer having an associated quantization noise spectrum that are connected in a feedback loop and together convert an analog input signal having a signal spectrum into a digital output signal, said quantizer oversampling the input signal to expand the bandwidth of the modulator so that the signal spectrum occupies a portion of the expanded bandwidth, said resonator being tunable to shape the quantizer's quantization noise spectrum so that the bulk of the quantization noise in the digital output signal occurs outside the signal spectrum, said tunable Gm-C resonator comprising:
- a pair of integrating capacitors having capacitances C1 and C2 that are connected at first and second summing nodes, respectively;
- a fixed transconductance cell having transconductance G1 that is connected between the first and second summing nodes; and
- a tunable transconductance cell having a variable transconductance $G_T$ that is connected between the first and second summing nodes in an anti-parallel configuration with said fixed transconductance cell, said resonator having a frequency response H(s) of:

$$H(s) = \frac{S}{S^2 + \omega_0^2}$$

where $\omega_0=[(G1G_T)/(C1C2)]^{0.5}$.

10. The tunable ΔΣ modulator of claim 9, wherein said resonator conducts a pair of common mode currents that set common mode voltages at the first and second summing nodes, said tunable transconductance cell having a tunable transconductance $G_T$ and comprising:
- a fixed transconductance cell having a transconductance $G_f$ that converts a voltage signal v(t) across the second integrating capacitor C2 into a differential mode current and imposes it onto the common mode currents;
- a current divider that apportions the common mode currents in response to a control signal to scale the differential mode current; and
- a recombination circuit that restores the common mode currents so that the differential mode current is scaled by a factor α, the common mode currents are insensitive to α such that the common mode voltages are stable, and the tunable transconductance $G_T=\alpha G_f$.

11. The tunable ΔΣ modulator of claim 10, wherein said resonator further comprises a pair of positive current sources (PCSs) that supply said common mode currents at said first and second summing nodes, respectively, each of said PCSs comprising a pair of unity gain inverting amplifiers that are connected in anti-parallel across a pair of resistors having resistance R to supply said common mode currents, said PCS having a common mode impedance of approximately R/2 and a differential mode impedance approaching infinity.

12. The tunable ΔΣ modulator of claim 10, wherein said resonator further comprises a pair of positive current sources (PCSs) that supply said common mode currents at said first and second summing nodes, respectively, each of said PCSs comprising a differential unity gain inverting amplifier having inverting and non-inverting sides and a pair of resistors having resistance R that are connected across the amplifier's inverting and non-inverting sides, respectively, to supply said common mode current, said PCS having a common mode impedance of approximately R/2 and a differential mode impedance approaching infinity.

13. The tunable ΔΣ modulator of claim 9, further comprising a second input transconductance cell and a second tunable resonator connected in cascade with said input transconductance cell with said output voltage signal being fed back through said DAC to said second input transconductance cell and said second tunable resonator, said second tunable resonator having a resonant frequency $\omega_1$, said first and second tunable resonators' resonant frequencies being tuned to shape the quantization noise spectrum to reduce the quantization noise across said signal spectrum.

14. A tunable Delta Sigma ($\Delta\Sigma$) modulator, comprising:

an input transconductance cell that converts an analog voltage signal, which has a signal spectrum that occupies a known bandwidth, into an analog current signal at a first summing node;

a tunable resonator having a resonant frequency $\omega_0$ that is connected to the first summing node and generates an integrated voltage signal at a second summing node;

a quantizer that oversamples the integrated voltage signal and converts it into a digital output voltage signal, said output voltage signal having an output spectrum that is the sum of the signal spectrum and a quantization noise spectrum;

a feedback path which returns said digital output voltage signal to the first and second summing nodes; and a digital-to-analog converter (DAC) in the feedback path that converts said digital output voltage signal into reproducible current levels;

said tunable resonator comprising a positive current source (PCS) that supplies a common mode current at said first and second summing nodes, a fixed Gm cell having a transconductance $G_f$, and a current divider and recombination circuit that modulates a differential mode current imposed on said common mode current to multiply transconductance Gf by a scale factor $\alpha$ without affecting the common mode current to tune the resonator's resonant frequency and shape the quantization noise spectrum to reduce the quantization noise in said output spectrum over the known bandwidth, said PCS having a low common mode impedance that stabilizes the modulator's common mode operating point at said first and second summing nodes and having a high differential mode impedance that maintains a high quality factor.

15. The tunable $\Delta\Sigma$ modulator of claim 14, wherein said resonator has a resonant frequency range that includes DC, at which said resonator functions as an integrator that effectively high pass filters said quantization noise.

16. The tunable $\Delta\Sigma$ modulator of claim 15, for a resonant frequency range having a maximum resonant frequency of at least 100 MHz.

17. The tunable $\Delta\Sigma$ modulator of claim 14, wherein said known bandwidth is time varying, further comprising:

a feedback circuit that computes the signal-to-noise ratio (SNR) of said output spectrum and adjusts the resonator's resonant frequency to track a center frequency of the time varying bandwidth to reduce the quantization noise and maintain a high SNR.

18. The tunable $\Delta\Sigma$ modulator of claim 14, wherein said modulator low pass filters the signal spectrum.

19. A tunable Delta Sigma ($\Delta\Sigma$) modulator, comprising:

an input transconductance cell that converts a differential analog voltage signal, which has a signal spectrum that occupies a known bandwidth, into a differential analog current signal at a first differential summing node;

a first capacitor having capacitance C1 that is connected across the first differential summing node;

a second capacitor having capacitance C2 connected across a second differential summing node;

a fixed transconductance cell having transconductance G1 that is connected between the first and second differential summing nodes and generates a differential integrated voltage signal across the second capacitor;

a binary comparator that oversamples the integrated voltage signal and converts it into a binary output voltage signal, said binary output voltage signal having an output spectrum that is the sum of the signal spectrum and a quantization noise spectrum;

a binary digital-to-analog converter (DAC) that converts said binary output signal into a pair of differential current signals;

a feedback path that returns the differential current signals to the first and second summing nodes, respectively; and a tunable transconductance cell having a variable transconductance $G_T$ that is connected between the first and second differential summing nodes in anti-parallel with said fixed transconductance cell, said capacitors and the fixed and tunable transconductance cells together forming a resonator having a frequency response of:

$$H(s) = \frac{s}{s^2 + \omega_0^2}$$

and a resonant frequency $\omega_0 = [(G1 G_T)/(C1 C2)]^{0.5}$, said variable transconductance $G_T$ being tunable to select $\omega_0$ from a range that includes DC to shape the quantization noise spectrum to reduce the quantization noise in said output spectrum over the known bandwidth.

20. The tunable $\Delta\Sigma$ modulator of claim 19, wherein said resonator conducts a pair of common mode currents that set common mode voltages at the ends of said capacitors, said tunable transconductance cell having a tunable transconductance $G_T$ and comprising:

a fixed transconductance cell having a transconductance $G_f$ that converts a voltage signal v(t) across the second integrating capacitor C2 into a differential mode current and imposes it onto the common mode currents;

a current divider that apportions the common mode currents in response to a control signal to scale the differential mode current; and a recombination circuit that restores the common mode currents so that the differential mode current is scaled by a factor $\alpha$, the common mode currents are insensitive to $\alpha$ such that the common mode voltages are stable, and the tunable transconductance $G_T = \alpha G_f$.

21. The tunable $\Delta\Sigma$ modulator of claim 20, wherein said resonator further comprises a pair of positive current sources (PCSs) that supply said common mode currents at said first and second summing nodes, respectively, each of said PCSs comprising a pair of unity gain inverting amplifiers that are connected in anti-parallel across a pair of resistors having resistance R to supply said common mode current, said PCS having a common mode impedance of approximately R/2 and a differential mode impedance approaching infinity.

22. The tunable $\Delta\Sigma$ modulator of claim 20, wherein said resonator further comprises a pair of positive current sources (PCSs) that supply said common mode currents at said first and second summing nodes, respectively, each of said PCSs comprising a differential unity gain inverting amplifier having inverting and non-inverting sides and a pair of resistors having resistance R that are connected across the amplifier's inverting and non-inverting sides, respectively, to supply said common mode current, said PCS having a common mode impedance of approximately R/2 and a differential mode impedance approaching infinity.

23. An analog-to-digital converter (ADC), comprising a tunable Delta Sigma ($\Delta\Sigma$) modulator that oversamples an analog input voltage signal and quantizes it into a binary output signal, said binary output voltage signal having an output spectrum that is the sum of the input signal's spectrum, which occupies a known bandwidth, and a quantization noise spectrum, said tunable ΔΣ modulator being tunable to shape the quantization noise spectrum to reduce the quantization noise in said output spectrum over the known bandwidth;

a programmable digital filter having a passband and a stopband, said digital filter being programmable so that said passband passes said output spectrum and said stopband rejects said quantization noise; and a decimator that subsamples the digitally filtered binary output signal to generate an n-bit digital signal at a sampling frequency, said ΔΣ modulator comprising:

an input transconductance cell that converts the analog voltage signal into an analog current signal at a first summing node;

a first capacitor having capacitance C1 that is connected at the first summing node;

a second capacitor having capacitance C2 connected at a second summing node;

a fixed transconductance cell having transconductance G1 that is connected between the first and second summing nodes and generates an integrated voltage signal across said second capacitor;

a binary comparator that oversamples the integrated voltage signal and converts it into the binary output voltage signal;

a binary digital-to-analog converter (DAC) that converts said binary output signal into a pair of current signals;

a feedback path that returns the current signals to the first and second summing nodes, respectively; and a tunable transconductance cell having a variable transconductance $G_T$ that is connected between the first and second differential summing nodes in anti-parallel with said fixed transconductance cell, said capacitors and the fixed and tunable transconductance cells together forming a resonator having a frequency response of:

$$H(s) = \frac{s}{s^2 - \omega_0^2}$$

and a resonant frequency $\omega_0 = [(G1 G_T)/(C1 C2)]^{0.5}$, said variable transconductance $G_T$ being tunable to select $\omega_0$ from a range that includes DC to shape the quantization noise spectrum to reduce the quantization noise in said output spectrum over the known bandwidth.

24. The tunable ΔΣ modulator of claim 23, wherein said resonator conducts a pair of common mode currents that set common mode voltages at said first and second summing nodes, said tunable transconductance cell having a tunable transconductance $G_T$ and comprising:

a fixed transconductance cell having a transconductance $G_f$ that converts a voltage signal v(t) across the second integrating capacitor C2 into a differential mode current and imposes it onto the common mode currents;

a current divider that apportions the common mode currents in response to a control signal to scale the differential mode current; and a recombination circuit that restores the common mode currents so that the differential mode current is scaled by a factor α, the common mode currents are insensitive to α such that the common mode voltages are stable, and the tunable transconductance $G_T = \alpha G_f$.

25. The tunable ΔΣ modulator of claim 24, wherein said resonator further comprises a pair of positive current sources (PCSs) that supply said common mode currents at said first and second summing nodes, respectively, each of said PCSs comprising a pair of unity gain inverting amplifiers that are connected in anti-parallel across a pair of resistors having resistance R to supply said common mode current, said PCS having a common mode impedance of approximately R/2 and a differential mode impedance approaching infinity.

26. The tunable ΔΣ modulator of claim 24, wherein said resonator further comprises a pair of positive current sources (PCSs) that supply said common mode currents at said first and second summing nodes, respectively, each of said PCSs comprising a differential unity gain inverting amplifier having inverting and non-inverting sides and a pair of resistors having resistance R that are connected across the amplifier's inverting and non-inverting sides, respectively, to supply said common mode current, said PCS having a common mode impedance of approximately R/2 and a differential mode impedance approaching infinity.

27. A tunable Delta Sigma (ΔΣ) modulator comprising a tunable Gm-C resonator and a quantizer having an associated quantization noise spectrum that are connected in a feedback loop and together convert an analog input signal having a signal spectrum into a digital output signal, said quantizer oversampling the input signal to expand the bandwidth of the modulator so that the signal spectrum occupies a portion of the expanded bandwidth, said tunable resonator comprising a positive current source (PCS) that supplies a common mode current, a fixed Gm cell having a transconductance $G_f$, and a current divider and recombination circuit that modulates a differential mode current imposed on said common mode current to multiply transconductance Gf by a scale factor α without affecting the common mode current to shape the quantizer's quantization noise spectrum so that the bulk of the quantization noise in the digital output signal occurs outside the signal spectrum, said PCS having a low common mode impedance that stabilizes the modulator's common mode operating point and having a high differential mode impedance that maintains a high quality factor.

28. An analog-to-digital converter (ADC), comprising:

a tunable Delta Sigma (ΔΣ) modulator that oversamples an analog input voltage signal and quantizes it into a binary output signal, said binary output voltage signal having an output spectrum that is the sum of the input signal's spectrum, which occupies a known bandwidth, and a quantization noise spectrum, said tunable ΔΣ modulator comprising a positive current source (PCS) that supplies a common mode, a fixed Gm cell having a transconductance Gf, and a current divider and recombination circuit that modulates a differential mode current imposed on said common mode current to multiply transconductance Gf by a scale factor without affecting the common mode current to shape the quantization noise spectrum to reduce the quantization noise in said output spectrum over the known bandwidth, said PCS having a low common mode impedance that stabilizes the modulator's common mode operating point at said first and second summing nodes and having a high differential mode impedance that maintains a high quality factor;

a programmable digital filter having a passband and a stopband, said digital filter being programmable so that said passband passes said output spectrum and said stopband rejects said quantization noise; and a decimator that subsamples the digitally filtered binary output signal to generate an n-bit digital signal at a sampling frequency.

\* \* \* \* \*